United States Patent [19]

Tisinger

[11] Patent Number: 4,829,197
[45] Date of Patent: May 9, 1989

[54] DRIVER CIRCUIT WITH BOOST AND FEEDBACK PORTIONS FOR IMPROVING OUTPUT RISETIME AND REDUCING PROPAGATION DELAY

[75] Inventor: Eric W. Tisinger, Chandler, Ariz.
[73] Assignee: Motorola, Inc., Schaumburg, Ill.
[21] Appl. No.: 172,826
[22] Filed: Mar. 25, 1988
[51] Int. Cl.⁴ ............ H03K 4/58; H03K 17/04; H03K 17/687; H03K 19/013
[52] U.S. Cl. .................... 307/270; 307/254; 307/454; 307/482
[58] Field of Search ............. 307/270, 254, 255, 454, 307/455, 456, 457, 466, 467, 482

[56] References Cited
U.S. PATENT DOCUMENTS

| | | |
|---|---|---|
| 3,867,644 | 2/1975 | Cline ................................ 307/457 |
| 4,321,490 | 3/1982 | Bechdolt ........................... 307/456 |
| 4,698,519 | 10/1987 | Cini et al. ....................... 307/254 |
| 4,701,631 | 10/1987 | Chieli .............................. 307/254 |
| 4,739,190 | 4/1988 | Alzati et al. .................... 307/270 |

Primary Examiner—Stanley D. Miller
Assistant Examiner—Trong Quang Phan
Attorney, Agent, or Firm—Michael D. Bingham

[57] ABSTRACT

A driver circuit for driving capacitive loads comprises a regenerative high side driver and a low side driver. A boost circuit responsive to an input signal turns the regenerative high side driver on hard producing a very fast output rise time. A feedback circuit is provided which disables the boost circuit when the output voltage reaches a predetermined value conserving supply current. A sustaining resistor provides base current to maintain the high side driver on after the feedback circuit has disabled the boost circuit.

7 Claims, 1 Drawing Sheet

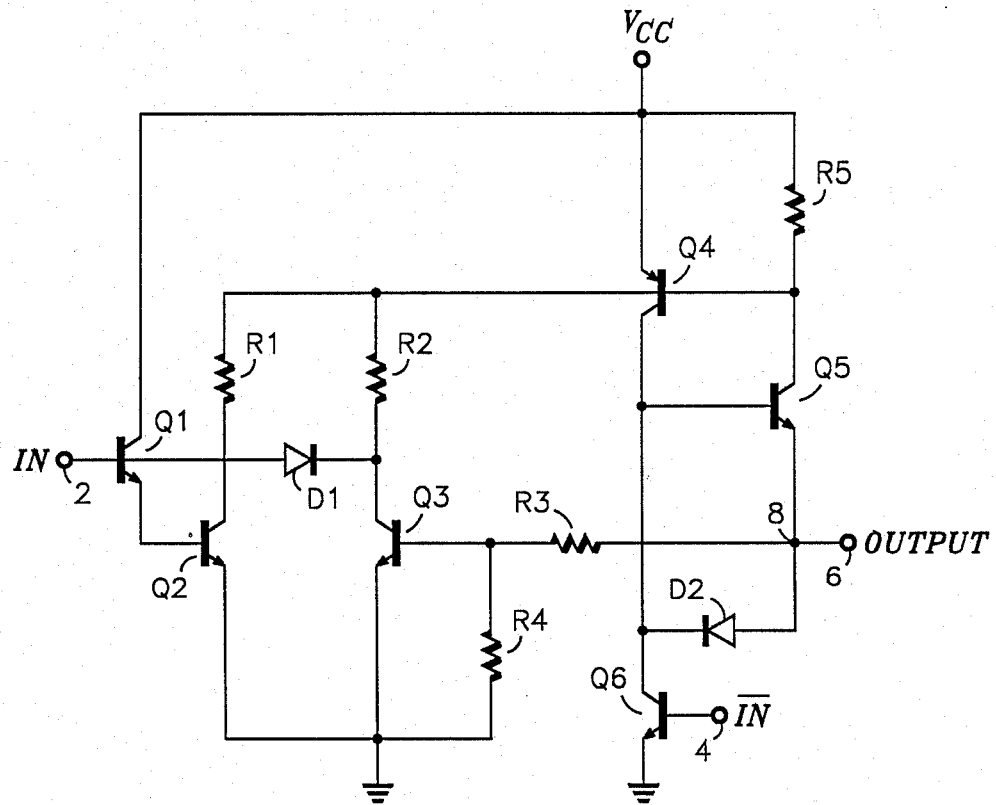

DRIVER CIRCUIT WITH BOOST AND FEEDBACK PORTIONS FOR IMPROVING OUTPUT RISETIME AND REDUCING PROPAGATION DELAY

BACKGROUND OF THE INVENTION

This invention relates generally to a driver circuit for driving capacitive loads, and more particularly to a driver circuit including boost and feedback portions which result in a faster output rise time and reduce the propagation delay.

Driver circuits which drive, for example, MOS field-effect-transistors (MOSFETS) typically include an output node, a high/side driver for raising the potential of the output node, a low/side driver for reducing the potential of the output node, and an input stage for controlling the high and low side drivers.

It is known, for example, to use a regenerative trigger circuit with limited gain as the top side driver. The trigger circuit includes a PNP current mirror circuit and one or more NPN transistors coupled to the output node. A small portion of the NPN collector current is fed back to the PNP mirror so as to provide additional base current to the NPN devices. Thus, the potential to the output node will begin to rise before current regeneration in the trigger circuit can occur thus degrading output rise time. Additionally, the drive current to the PNP mirror circuit will be affected by output loading; i.e. while loads will degrade output rise time.

U.S. Pat. No. 4,701,631 entitled MONOLITHICALLY INTEGRATED CONTROL CIRCUIT FOR THE SWITCHING OF TRANSISTORS discloses a driver circuit for driving inductive loads. The driver disclosed in this patent includes a boost circuit which provides a boost current pulse to the top side driver. The length o this boost pulse is determined by an RC time constant, not by the voltage on the output node. Furthermore, since the load is inductive, there is little output current during the rise time. With a capacitive load, however, there is an immediate need for a large output current.

SUMMARY OF THE INVENTION

It is an object of the present invention to provide an improved driver circuit for driving capacitive loads.

It is a further object of the present invention to provide a driver circuit exhibiting a faster output rise time.

It is a still further object of the present invention to provide a driver circuit which exhibits lower signal propagation delay.

Yet another object of the present invention is to provide a driver circuit for driving capacitive loads and including a regenerative trigger circuit and a boost circuit.

According to a broad aspect of the invention there is provided a driver circuit which includes an output node; first means responsive to a first input signal for reducing the voltage of the output node; regenerative means for increasing the voltage of the output node; a boost circuit responsive to a second input signal and couple to the regenerative means for providing a boost current to said regenerative means; feedback means coupled to the output node and to the boost circuit for disabling the boost circuit when the voltage at the output node reaches a predetermined value; and sustaining means for maintaining the regenerative means on after the boost circuit has been disabled by the feedback means.

BRIEF DESCRIPTION OF THE DRAWINGS

The above and other objects, features and advantages of the present invention will be more clearly understood from the following detailed description taken in conjunction with the accompanying drawing which is a schematic diagram of the invention driver circuit.

DESCRIPTION OF THE PREFERRED EMBODIMENT

Referring to the drawing, the inventive driver circuit includes first and second input terminals 2 and 4 for receiving complimentary input signals IN and $\overline{IN}$ respectively, and an output terminal 6 coupled to node 8 at which the driver's output signal (OUTPUT) is generated. The driver may be thought of as comprising an input circuit, a boost circuit, a high side driver, a low side driver, and a feedback circuit.

The input circuit comprises NPN transistor Q1 having a base coupled to an input terminal 2, a collector coupled to a source of supply voltage $V_{CC}$ and having an emitter.

The boost circuit comprises NPN transistor Q2 and resistor R1. The base of transistor Q2 is coupled to the emitter of transistor Q1, its emitter is coupled to a second source of supply voltage (e.g. ground), and its collector is coupled to a first terminal of resistor R1.

The top side driver circuit includes PNP transistor Q4, NPN transistor Q5 and resistor R5. Both the second terminal of resistor R1 and a first terminal of resistor R2 are coupled to the base of transistor Q4 and to the collector of transistor Q5. The base of transistor Q4 is also coupled via resistor R5 to the emitter of transistor Q4 which is coupled to a source of supply voltage $V_{cc}$. The base of NPN transistor Q5 is coupled to the collector of transistor Q4, and the emitter of transistor Q5 is coupled to output node 8.

The low side driver circuit includes diode D2 and NPN transistor Q6. Diode D2 has an anode coupled to output node 8 and a cathode coupled to the base of transistor Q5 and to the collector of transistor Q6. Transistor Q6 has an emitter coupled to ground and a base coupled to input terminal 4 for receiving complementary input signal $\overline{IN}$.

Finally, the feedback circuit includes resistors R2, R3 and R4, NPN transistor Q3 and diode D1. Resistor R3 has a first terminal coupled to node 8 and a second terminal coupled to the base of transistor Q3. Resistor R4 has a first terminal coupled to the base of transistor Q3 and a second terminal coupled to ground. The emitter of transistor Q3 is coupled to ground, and its collector is coupled to the cathode of diode D1 and to the first terminal of R2. The anode of diode D1 is coupled to the base of transistor Q1 and to input terminal 2.

The inventive driver circuit operates as follows. When $\overline{IN}$ goes high (IN is low) transistor Q6 turns on sinking current from node 8 via diode D2. In addition, Q6 diverts all base current from transistor Q5 preventing transistor Q5 from turning on. In this manner, Q5 cannot source any current to node 8 and therefore the voltage at output terminal 6 is low.

When IN goes high ($\overline{IN}$ goes low) transistor Q6 turns off and transistor Q1 turns on providing base drive to transistor Q2 turning it on. This sets up a boost current through resistor R1 (e.g. 15 milliamps) which is applied to the base of PNP transistor Q4. This provides a large base drive to NPN transistor Q5. Thus, after a short delay, Q5 is driven on hard. Collector current of Q5 is fed back to the base of PNP transistor Q4 providing additional drive to transistor Q4 which, like the boost current, is multiplied by the current gain of transistor Q4. In this manner, the voltage at node 8 is caused to rise very quickly.

When the voltage at node 8 reaches a predetermined value which is determined by the ratio of resistors R3 and R4, NPN transistor Q3 turns on thus diverting base current from transistor Q1 via diode D1. This causes transistors Q1 and Q2 to turn off terminating the boost current through R1. However, a sustaining current through resistor R2 is set up which maintains PNP transistor Q4 on.

Thus, there has been shown and described a driver circuit for driving capacitive loads which exhibits a fast output rise time. This is accomplished because there is no slow output ramp prior to regeneration of the trigger circuit. Further, the turn-on delay is reduced by switching the PNP transistor with a large boost current pulse.

The above description is given by way of example only. Changes in form and details may be made by one skilled in the art without departing from the scope of the invention as defined by the appended claims.

I claim:

1. A driver circuit, comprising:
   an output node;
   means coupled to said node and responsive to a first input signal for reducing the voltage of said output node;
   regenerative means coupled to said output node and responsive to a boost current for increasing the voltage of said output node;
   a boost circuit responsive to a second input signal and coupled to said regenerative means for providing said boost current to said regenerative means;
   feedback means coupled to said output node and to said boost circuit for disabling said boost circuit when the voltage at said output node reaches a predetermined value; and
   said feedback means including sustaining means for maintaining said regenerative means on after said boost circuit has been disabled by said feedback means.

2. A driver circuit according to claim 1 wherein said regenerative means comprises:
   an NPN output transistor having an emitter coupled to said output node and having base and collector terminals; and
   a PNP transistor having a collector coupled to the base of said output transistor, an emitter coupled to the collector of said output transistor and a base coupled to said boost circuit and to said sustaining means.

3. A driver circuit according to claim 2 wherein said boost circuit comprises:
   a first transistor having a base terminal coupled to receive said second signal, a collector terminal for coupling to a first source of supply voltage, and having an emitter terminal;
   a second transistor having a base terminal coupled to the emitter terminal of said first transistor, an emitter terminal for coupling to a second source of supply voltage, and having a collector terminal; and
   first resistive means coupled between the collector of said second transistor and the base of said PNP transistor.

4. A driver circuit according to claim 3 wherein said feedback means comprises:
   a resistive divider network coupled to said output node;
   a third transistor having a base coupled to said resistive divider network, an emitter for coupling to said second source of supply voltage and having a collector; and
   diode means having an anode coupled to the base of said first transistor and a cathode coupled to the collector of said third transistor.

5. A driver circuit according to claim 4 wherein said sustaining means comprises second resistive means coupled between the collector of said third transistor and the base of said PNP transistor.

6. A driver circuit according to claim 5 wherein said first means comprises:
   a fourth transistor having a base for receiving said first input signal, an emitter for coupling to said second source of supply voltage and a collector coupled to the base of said output transistor; and
   second diode means having an anode coupled to the said output node and having a cathode coupled to the collector of said fourth transistor.

7. A driver circuit according to claim 6 wherein said first and second input signals are complementary signals.

* * * * *